United States Patent [19]

Atobe

[11] Patent Number: 4,479,099
[45] Date of Patent: Oct. 23, 1984

[54] MULTIPLE PHASE MODULATOR FOR N SETS OF DIGITAL DATA

[75] Inventor: Masaaki Atobe, Tokyo, Japan

[73] Assignee: Nippon Electric Co., Ltd., Tokyo, Japan

[21] Appl. No.: 374,656

[22] Filed: May 4, 1982

[30] Foreign Application Priority Data

May 7, 1981 [JP] Japan .................................. 56-67647

[51] Int. Cl.³ ........................ H03K 7/06; H04L 27/20
[52] U.S. Cl. ........................................ 332/10; 332/21;
332/22; 340/347 DD; 375/53; 375/54; 375/67
[58] Field of Search .................... 332/9 R, 9 T, 10, 21,
332/22; 375/22, 23, 52, 53, 54, 67; 340/347
DD, 347 AD

[56] References Cited

U.S. PATENT DOCUMENTS 3,970,946  7/1976  Matsuo ............................. 329/132 X
4,153,814  5/1979  Burgert ............................. 375/67 X
4,352,192  9/1982  Perez et al. ...................... 329/104 X
4,417,219 11/1983  Brossard et al. .................... 332/9 R

FOREIGN PATENT DOCUMENTS 38778  3/1980  Japan .................................... 332/10

OTHER PUBLICATIONS

Miyauchi, K. et al., "New Technique for Generating and Detecting Multilevel Signal Formate", *IEEE Transactions on Communications*, vol. COM-24, No. 2, (Feb. 1976), pp. 263-267.

Primary Examiner—Siegfried H. Grimm
Assistant Examiner—David C. Mis
Attorney, Agent, or Firm—Sughrue, Mion, Zinn, Macpeak & Seas

[57] ABSTRACT

A $2^N$-phase phase modulator is formed from a plurality of series-connected 2-phase phase modulators. Each of the 2-phase phase modulators includes an Exclusive OR gate receiving at one input terminal one of a plurality of digital data sets. The first phase modulator receives a carrier signal at its other input terminal, and all subsequent phase modulators receive an output from a previous phase modulator through a ½ frequency divider.

7 Claims, 31 Drawing Figures

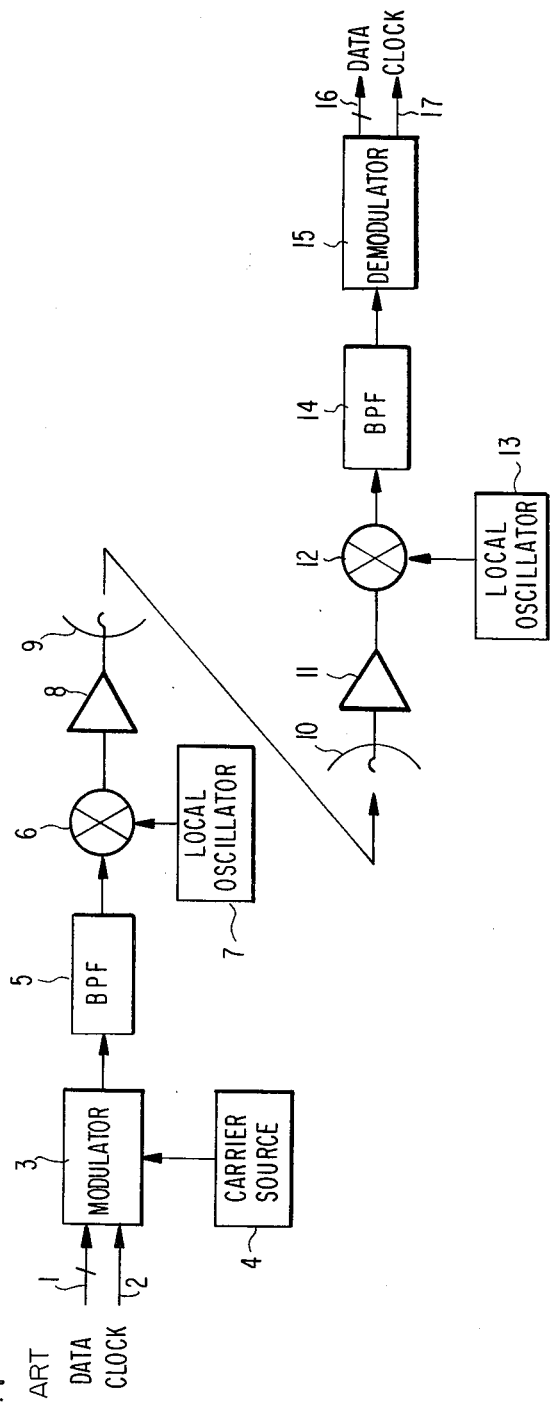
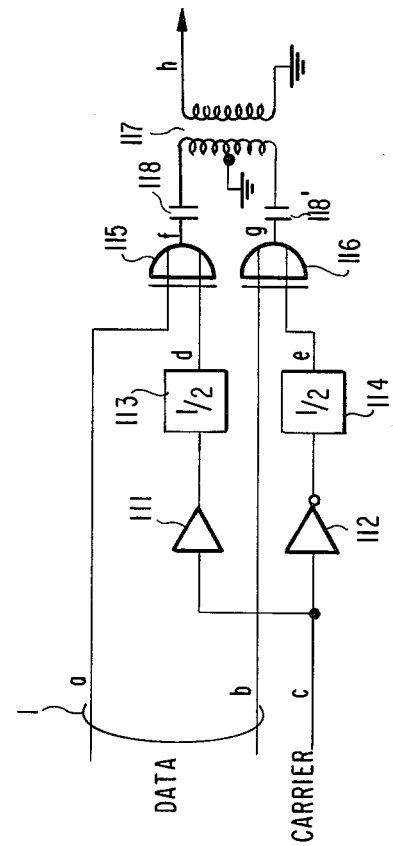
FIG. 1 PRIOR ART
FIG. 2 PRIOR ART

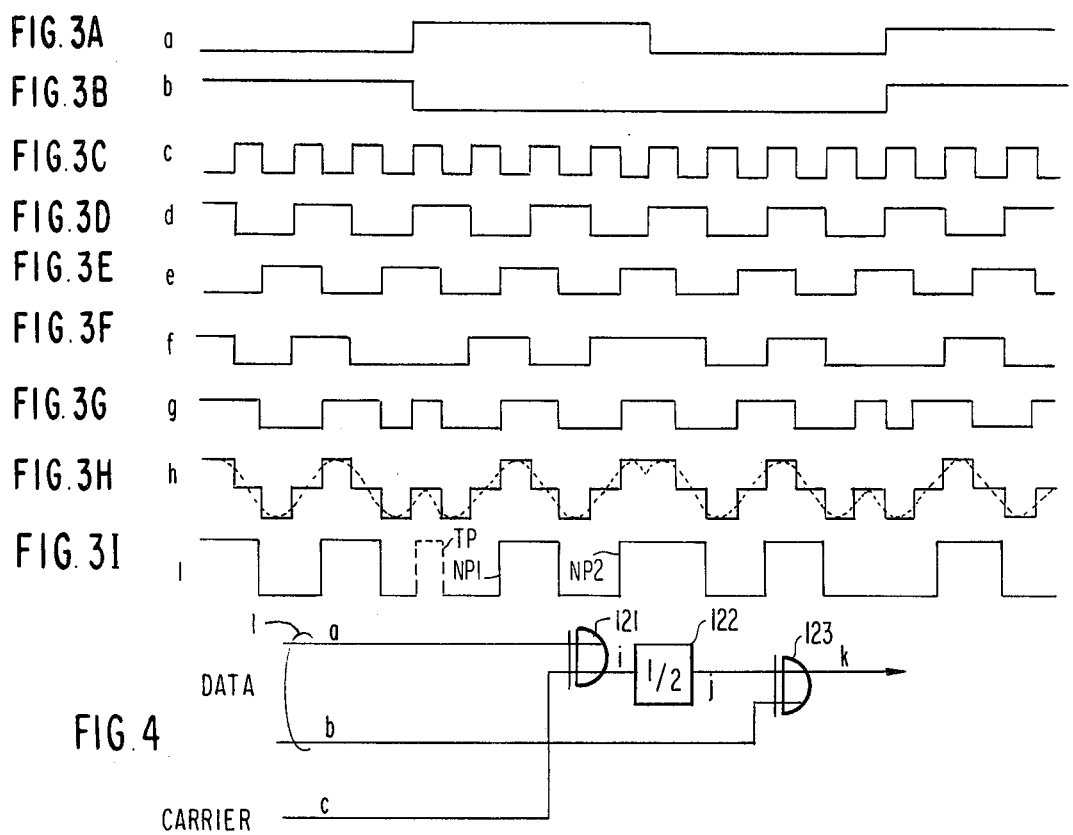
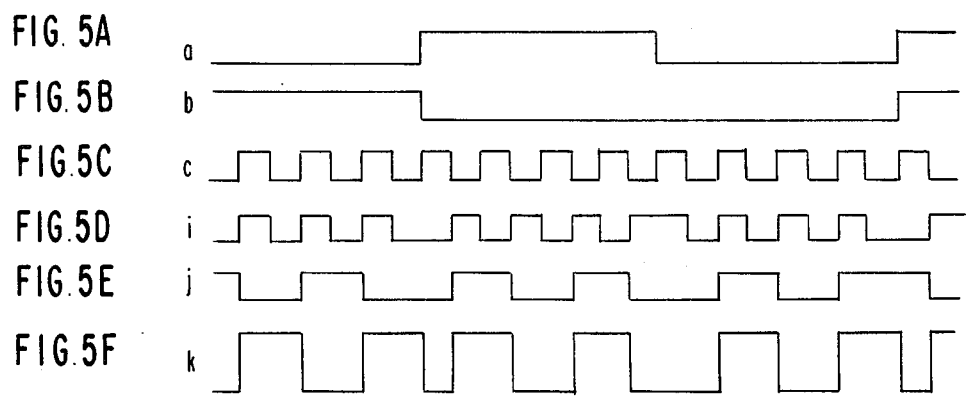
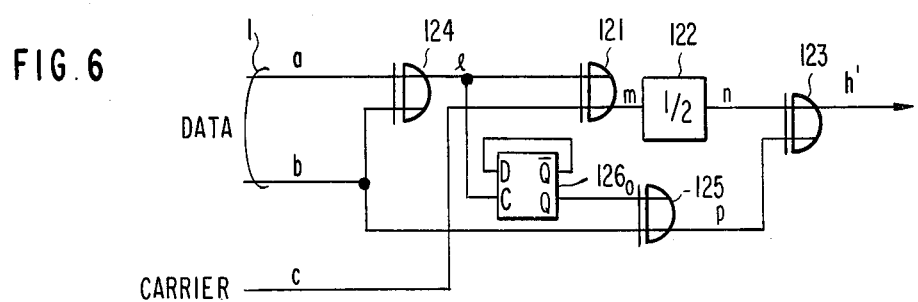

FIG.10A  a 
FIG.10B  b 
FIG.10C  c 
FIG.10D  l 
FIG.10E  m 
FIG.10F  n 
FIG.10G  o 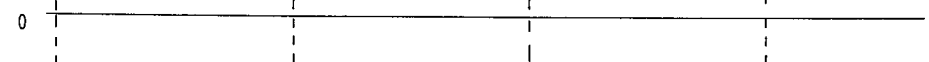
FIG.10H  p 
FIG.10I  h' 

MULTIPLE PHASE MODULATOR FOR N SETS OF DIGITAL DATA

BACKGROUND OF THE INVENTION

The present invention relates to a multiple phase modulator and, more particularly, to a $2^N$-phase digital signal phase modulator where N denotes an integer equal to or greater than 2 and is equal to the number of digital signals input to the modulator.

The conventional modulator used for digital communication system is usually made of a double-balanced (or "ring") modulator operative up to the VHF band. For a frequency region higher than the VHF band, a modulator using a distributed constant circuit has been generally used. Those modulators are complicated and, therefore, require a large amount of time for adjustments.

For frequency bands lower than VHF band, $2^N$-phase digital phase modulators have been put into practical use since integrated digital counter circuits can be used for such low frequency bands. This type of conventional 4-phase phase modulator comprises two circuit arrays arranged in parallel, each array including a ½ frequency-divider counter circuit and a 2-phase modulator circuit (e.g. an exclusive OR circuit). The 4-phase phase modulator also includes a combining circuit such as a transformer to combine signals from the two circuit arrays. Likewise, 8-phase phase modulators require at least three counter circuits, three 2-phase modulator circuits and two combining circuits.

These conventional modulators are costly to manufacture because they require a large number of counters and a transformer, which are not suited for fabrication in the form of an integrated circuit. Also, phase errors are unavoidable due to fluctuations in delay caused by the two arrays, thereby deteriorating the characteristics in the combined output.

SUMMARY OF THE INVENTION

An object of the present invention is, therefore, to provide a $2^N$-phase phase modulator circuit having a smaller number of ½ frequency-divider counter circuits and including no transformer.

According to the present invention, there is provided a $2^N$-phase phase modulator (N is a positive integer) for providing a $2^N$-phase phase modulated signal by phase-modulating a carrier wave with N sets of digital data, comprising: N sets of 2-phase phase modulating means arranged serially to each other and respectively having two input terminals, one of the input terminals of each modulator being supplied respectively with each set of the N sets of digital data and the other of the two input terminals each being supplied with signals 2-phase phase modulated with the digital data applied to the one of the two input terminals, the other of the two input terminals of the first one of the N sets of 2-phase phase modulating means being supplied with the carrier wave; and (N-1) sets of ½ frequency-dividing means connected between each of the N sets of 2-phase phase modulating means for frequency-dividing by one half the input signals thereto, respectively; whereby the $2^N$-phase phase modulator signal is provided at the output of the final stage of the N sets of 2-phase phase modulating means.

Other features and advantages of the present invention will become more apparent from the detailed description taken in conjunction with the accompanying drawings.

BRIEF DESCRIPTION OF THE DRAWINGS

FIG. 1 is a block diagram illustrating a transmitter/receiver apparatus using a $2^N$-phase phase modulator circuit;

FIG. 2 is a block diagram showing a conventional 4-phase phase modulator circuit;

FIGS. 3A to 3I are time charts for describing the modulator circuit shown in FIG. 2;

FIG. 4 is a block diagram of an embodiment of the 4-phase phase modulator circuit according to the present invention;

FIGS. 5A to 5F are time charts for describing the modulator circuit shown in FIG. 4;

FIG. 6 is a block diagram of another embodiment of the 4-phase phase modulator circuit according to the present invention;

FIGS. 10A to 10I are time charts for describing the modulation circuit shown in FIG. 6.

DESCRIPTION OF THE PRIOR ART

Figure 7:
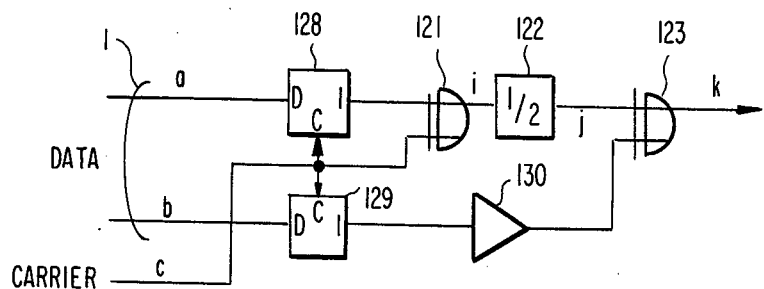
FIG. 7 is a block diagram of still another embodiment of the 4-phase phase modulator circuit according to the present invention.

In FIG. 1, a $2^N$-phase phase modulator circuit 3 modulates a carrier wave supplied from a carrier wave source 4 with the N sets of data supplied from a line 1 to provide a $2^N$-phase phase modulated carrier wave. The clock signal from a line 2 is used to re-time the N sets of data. The modulated carrier wave from the modulator 3 is shaped in waveform by a band pass filter (BPF) 5 and then is frequency-converted by a transmitting mixer 6 to radio frequency band. A local oscillator 7 supplies a local oscillation to the transmitting mixer 6. The frequency-converted output is amplified by a power amplifier 8 and then transmitted through an antenna 9 to the receiving end.

At the receiving end, an antenna 10 picks up the transmitted signal and then supplies it to a radio frequency (RF) amplifier 11. After amplification, a receiving mixer 12 frequency-mixes the amplified signal with the local oscillation signal from a local oscillator 13 to convert it into an intermediate frequency band (IF). The IF signal is supplied through a band pass filter 14 to a $2^N$-phase phase demodulator 15 for demodulation by the N sets of data again to be transmitted from the line 16. The clock signal regenerated by the demodulator 15 is transmitted from a line 17 to be used for retiming of the N sets of data etc. in the circuits provided subsequently thereafter. For details of the $2^N$-phase phase modulated wave demodulator 15, reference is made to the U.S. Pat. No. 3,970,946, granted to Y. Matsuo, July 20, 1976 and assigned to the present applicant.

Now referring to FIGS. 2 and 3A to 3I, an example of the prior art $2^N$-phase phase modulator 3 shown in FIG. 1 is described; wherein N is 2 and, therefore, this is an example of a 4-phase phase modulator. The retiming of the data sets by the clock signals referred to in FIG. 1 is omitted because it is not directly related to the present invention and is well understood in the art, and such retiming will also be omitted from the following explanation. In FIG. 2 the reference numeral 111 denotes an amplifying circuit; 112 a polarity-converting amplifier circuit; 113 and 114, $\frac{1}{2}$ frequency-dividing counter circuits; 115 and 116, exclusive OR (EX-OR) circuits having a 2-phase modulating function; 117, a transformer for combining signals from the EX-OR circuits 115 and 116; and 118 and 118', capacitors for DC blocking. The reference characters a and b denote baseband digital signals (data signals); c, a carrier wave signal; d, e, f and g, the output signals from respective circuits at intermediate points; and h, the output signal from the modulator.

The phase of the carrier wave c is shifted by $\pi$ (180°) by waveform amplifiers 111 and 112. The counter circuits 113 and 114 respectively frequency-divide the outputs of amplifiers 111 and 112 by one half to provide signals d and e staggered by $\pi/2$ (90°) with respect to each other, as shown in FIGS. 3D and 3E. The outputs d and e therefrom are subjected to exclusive OR logic operation with respective baseband signals a and b at the circuits 115 and 116, thereby being modulated in 0-$\pi$ of two sequences. Two outputs f and g thus generated have their DC components removed by the capacitors 118 and 118', are then vectorially added by the combining transformer 117 and finally become the intended 4-phase phase modulated output signal h.

In the time charts of FIGS. 3A to 3H, reference characters a through h indicate the waveforms of respective signals described above. In the output signal h of the modulator, the solid line indicates the waveform which expresses the signal as obtained while the broken line indicates the waveform which is obtained by passing through the BPF 5 (FIG. 1) to eliminate the harmonic component therefrom.

The prior art modulator described above, as is mentioned earlier, has two frequency-divider counter circits, i.e., $\frac{1}{2}$ frequency-dividing counter circuits 113 and 114, and since it has a combining transformer 117, the fabrication in the form of an integrated circuit is difficult and the band width of usable frequency is limited. Further, since it is divided into two circuit arrays, phase errors are unavoidable, and this deteriorates the waveform of the output.

DETAILED DESCRIPTION OF THE PREFERRED EMBODIMENT

In the embodiment shown in FIG. 4, the signals a, b and c on the input side represent the same signals as in FIG. 2 while the reference numeral 121 denotes an EX-OR circuit; 122, a $\frac{1}{2}$ frequency-divider counter circuit; and 123, an EX-OR circuit. The reference characters i and j denote the circuit outputs at an intermediate point; and k, the output from the modulator. The remaining circuits therein may be the same circuits with the same names as in the prior art of FIG. 2.

Referring now to FIG. 4 and the self-explanatory waveform diagrams of FIGS. 5A–5F, the first baseband signal a and the carrier wave signal c are subjected to exclusive OR logic operation at the circuit 121 for 2-phase modulation and the output i therefrom is halved in frequency by the counter circuit 122 to provide 0-$\pi/2$ modulated signal j. Then the EX-OR circuit 123 takes exclusive OR logic operation between the output signal j and the second base band signal b for 2-phase phase modulation (0-$\pi$ modulation) to obtain the output signal k which has become the 4-phase phase modulated wave. In the modulator of such a construction, the baseband signals a and b are time-staggered by an amount corresponding to the delay time, to compensate for the delay time at the EX-OR circuits 121 and 122. If both signals a and b are easily obtainable with the same timing, a buffer amplifier may be placed on the line of the baseband signal b. Such a modulator with the buffer amplifier will be described later.

As described above, the modulator of the present invention has only one counter circuit, or $\frac{1}{2}$ frequency divider counter circuit, 122 without requiring a transformer. The fabrication of the whole circuit in the form of an integrated circuit is therefore readily achieved. Since the modulator is not divided into two arrays, it does not suffer from such phase errors as are often encountered in the conventional modulators and hence is free from deterioration in the waveform of the output.

Although the waveform of the output k shown in FIG. 5F is different from a signal shown in FIG. 3I which is produced by digitizing the output h shown in FIG. 3H, it may be shaped to the same waveform in the manner to be described below in regards to FIG. 6.

In FIG. 6 showing another embodiment with like reference numerals showing like structural elements, two EX-OR circuits 124 and 125 and a counter circuit 126 are newly added. The operation of the modulator circuit of FIG. 6 will be described referring to FIGS. 10A through 10I. The baseband signals a and b are applied to the EX-OR circuit 124 whose output 1 is shown in FIG. 10D. The output 1 is then applied together with the carrier wave c to the EX-OR circuit 121 whose output m (FIG. 10E) is halved in frequency by the counter circuit 122 to provide a 0-90 /2 modulated signal n (FIG. 10F).

The counter circuit 126 counts the output pulse 1 to provide an output 0 shown in FIG. 10G. The counter circuit 126 is composed of a flip-flop having a clock input terminal, a data input terminal and first and second output terminals. The clock input terminal receives the output pulse 1 of the EX-OR circuit 124. The first flip-flop output terminal is coupled to the data input terminal. The output o of the flip-flop is provided at the second flip-flop output terminal and supplied to one input terminal of the EX-OR circuit 125. To the other input terminal of the EX-OR circuit 125 is supplied the baseband signal b. The EX-OR circuit 125 takes exclusive OR logic operation between the output o and the baseband signal b to provide an output p shown in FIG. 10H. With the EX-OR circuit 123, an exclusive OR combination of the signals n and p provides an output h', as shown in FIG. 10I. The output h' is identical to the digital output shown in FIG. 3I except for a pulse TP. In FIG. 3I, the pulse TP is eliminated at the transition point of data a and the beginning of a data period is affected by the phase condition of the previous data period in case of the circuit shown in FIG. 2. The next pulses NP1 and NP2, however, have phase information corresponding to the combination of data a (i.e., "1") and b (i.e., "0"). In addition, this phase information is identical to the phase information of the output h'. From the foregoing, it is easily understood that the output h' is essentialy of a digital waveform corresponding to the output h shown in FIG. 3H.

A still further embodiment shown in FIG. 7 produces an output k with the same waveform as the embodiment shown in FIG. 4. In addition to those structural elements described above, this embodiment has two retiming circuits 128 and 129 which retime the data a and b with a carrier wave and a buffer amplifier 130. In such a structure, the input baseband signals a and b are retimed with the carrier wave c so that the timing for polarity conversion of the baseband signals at the time when they are phase-converted by the EX-OR circuits 121 and 123 can be determined uniformly against the carrier wave phase. This results in alleviating the deterioration of the modulator output or the 4-phase phase modulated signal k caused by pattern jitter. The buffer amplifier 130 is used for compensating for the time delay caused by the passage through the EX-OR circuit 121 and the ½ frequency-dividing counter circuit 122.

Figure 8:
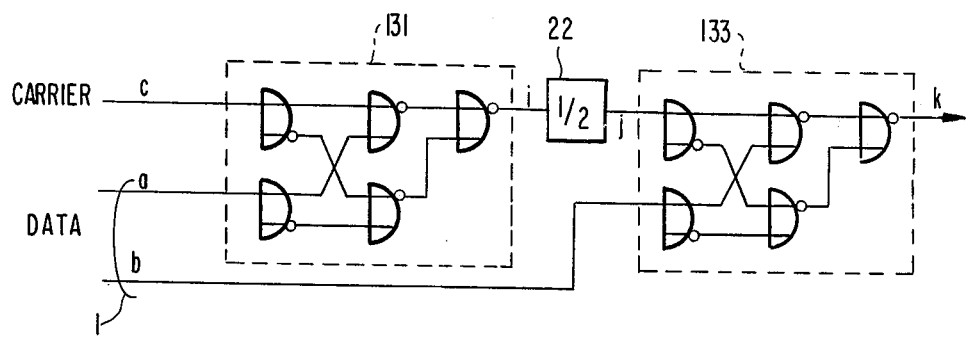
FIG. 8 is a block diagram showing a modification of the 4-phase phase modulator circuit shown in FIG. 3.

In still another embodiment shown in FIG. 8, the modulator is substantially identical to the one shown in FIG. 4, except that the EX-OR circuits 121 and 123 in FIG. 4 are replaced by logic circuits 131 and 133 having five gate circuits respectively. The logic circuits 131 and 133 have the exclusive OR function.

Figure 9:
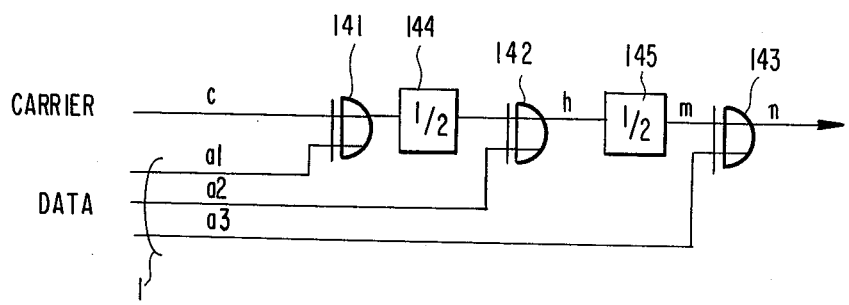
FIG. 9 is a diagram to show an embodiment of the 8-phase phase digital modulator circuit according to the present invention.

In FIG. 9 showing still another embodiment of an 8-phase phase modulation device, reference characters a1, a2, and a3 denote three sets of baseband signals 141, 142 and 143, EX-OR circuits; and 144 and 145, ½ frequency-divider counter circuits. The portion comprising the circuits 141, 144 and 142 is identical to that of the embodiment of FIG. 4. The circuit of FIG. 9 is like that of FIG. 4 except that additional circuits 143 and 145 are added. In the added portion, the 4-phase phase signal h obtained from the circuit corresponding to the one of FIG. 4 is frequency-divided by one half at frequency-divider counter circuit 145, into a 0–90 /4 modulated signal m, and then added with 2-phase phase modulation at the EX-OR circuit 143 to become an 8-phase modulated wave n as the output signal.

As has been described hereinabove, the present invention provides a simple $2^N$-phase digital phase modulator suited for fabrication in the form of an integrated circuit and capable of having higher waveform characteristics.

What is claimed is:

1. A $2^N$-phase phase modulator (where N is a positive integer) for providing a $2^N$-phase phase modulated signal by phase-modulating a carrier wave with N sets of digital data, comprising:

N 2-phase phase modulating means including a first 2-phase phase modulating means and N-1 subsequent 2-phase phase modulating means, each of said 2-phase phase modulating means having first and second input terminals and providing a phase-modulated output, each of said first input terminals being supplied with a respective one of said N sets of digital data, said second input terminal of said first 2-phase phase modulating means being supplied with said carrier wave; and (N-1) ½ frequency-dividing means each receiving and frequency-dividing by one half an output from a respective one of (N-1) of said 2phase phase modulating means, including said first 2-phase phase modulating means but excluding a last one of said (N-1) subsequent 2-phase phase modulating means, and for providing a frequency-divided phase-modulated signal to the second input terminal of a respective one of said subsequent 2-phase phase modulating means, whereby said $2^N$-phase phase modulated signal is provided at the output of said last one of said N 2-phase phase modulating means.

2. A $2^N$-phase phase modulator as claimed in claim 1, further comprising (N-1) delay compensating means respectively connected to the first input terminals of said subsequent 2-phase phase modulating means, for compensating for the delay time caused by a respective one of said 2-phase phase modulating means.

3. A $2^N$-phase phase modulator as claimed in claim 2, wherein each of said (N-1) delay compensating means includes a buffer amplifier.

4. A $2^N$-phase phase modulator as claimed in claim 3, further comprising means for retiming said N sets of digital data with said carrier wave.

5. A $2^N$-phase phase modulator as claimed in any one of claims 1, 2, 3 or 4, wherein each of said N 2-phase phase modulating means includes an exclusive OR circuit.

6. A $2^N$-phase phase modulator as claimed in any one of claims 1, 2, 3 or 4, further comprising band pass filter means connected to said last one of said N 2-phase phase modulating means for filtering the output of said last one.

7. A $2^N$-phase phase modulator as claimed in claim 1, further comprising:

a first additional 2-phase phase modulating means (124) for receiving first (a) and second (b) digital data signals as inputs and providing an output (l) as a first one of said N sets of digital data to said first input terminal of said first phase modulating means (121);

a flip-flop (126) having a clock input terminal (C), a data input terminal (D) and first and second output terminals (Q, Q̄) said clock input terminal receiving the output from said first additional 2-phase phase modulating means and said first flip-flop output terminal being coupled to said data input terminal; and second additional 2-phase phase modulating means (125) having a first input terminal coupled to said second flip-flop output terminal and having a second input terminal for receiving said second data signal, said second additional 2-phase phase modulating means providing its output as a second of said N sets of digital data to one of said subsequent 2-phase phase modulating means.

* * * * *

UNITED STATES PATENT AND TRADEMARK OFFICE
CERTIFICATE OF CORRECTION

PATENT NO. : 4,479,099

DATED : October 23, 1985

INVENTOR(S) : Masaaki ATOBE

It is certified that error appears in the above-identified patent and that said Letters Patent is hereby corrected as shown below:

Column 1, line 12, after "for", insert --a--.

Column 3, line 61, after "provide", insert --a--.

Column 4, line 31, "0-90/2" should be --0-$\pi$/2--.

Column 5, line 28, "0-90/4" should be --0-$\pi$/4--;

line 54, "2phase" should be --2-phase--.

Column 6, line 41, "(Q,Q)" should be --(Q,$\bar{Q}$).

Signed and Sealed this

Twentieth Day of August 1985

[SEAL]

*Attest:*

DONALD J. QUIGG

*Attesting Officer*     *Acting Commissioner of Patents and Trademarks*